United States Patent [19]
Santiago et al.

[11] Patent Number: 5,932,006
[45] Date of Patent: *Aug. 3, 1999

[54] BAF$_2$/GAAS ELECTRONIC COMPONENTS

[75] Inventors: Francisco Santiago, Elkridge; Tak Kin Chu, Bethesda, both of Md.

[73] Assignee: The United States of America as represented by the Secretary of the Navy, Washington, D.C.

[*] Notice: This patent is subject to a terminal disclaimer.

[21] Appl. No.: 08/624,847

[22] Filed: Mar. 25, 1996

Related U.S. Application Data

[62] Division of application No. 08/246,206, May 9, 1994, abandoned.

[51] Int. Cl.$^6$ .................................................. C30B 25/18
[52] U.S. Cl. .......................... 117/92; 117/108; 117/940
[58] Field of Search ............................ 117/92, 108, 940

[56] References Cited

U.S. PATENT DOCUMENTS

| | | |
|---|---|---|
| 4,291,327 | 9/1981 | Tsang . |
| 4,550,331 | 10/1985 | Milano . |
| 4,692,993 | 9/1987 | Clark et al. . |
| 4,847,666 | 7/1989 | Heremans et al. . |
| 5,124,762 | 6/1992 | Childs et al. . |
| 5,435,264 | 7/1995 | Santiago et al. . |

FOREIGN PATENT DOCUMENTS 2266569   10/1990   Japan .

OTHER PUBLICATIONS

"Photoemmission Study of the Formation of SrF$_2$/GaAs (100) and BaF$_2$/GaAs Interfaces", Colbow et al., Physical Review B, vol. 49, No. 3, 1750–1756 Jan. 15, 1994.

S.M. Sze –"Semiconductor Devices Physics and Technology", 1985, 208–210.

Clemens et al., "Growth of BaF$_2$ and of BaF$_2$/SrF$_2$ Layers on (001) oriented GaAs", J. Appl. Phys, vol. 66, No. 4, Aug. 15, 1989, pp. 1680–1683.

Truscott et al., "MBE Growth of BaF$_2$/ (Ga,In) (As, Sb) Structures", Journal of Crystal Growth, vol. 81 (1987) pp. 552–556.

Chaudhari et al., :Calcium fluoride Thin Films on GaAs (100) for Possible Metal–Insulator–Semiconductor Applications, Appl. Phys. Lett., vol. 62, No. 5, Feb. 22, 1993, pp. 1680–1685.

Hung et al., "Epitaxial Growth of Alkaline Earth Fluoride Films on HF–Treated Si and (NH$_4$)$_2$ Sx–Treated GaSa without in Situ Cleaning", Appl. Phys. Lett. vol. 60, No. 2, Jan. 13, 1992, pp. 201–203.

*Primary Examiner*—Robert Kunemund
*Attorney, Agent, or Firm*—James B. Bechtel, Esq.

[57] ABSTRACT

Metal insulator semiconductor field effect transistors (MISFETs), charge coupled devices (CCDs), and capacitors based on an epitaxial barium fluoride (BF$_2$) insulator layer deposited directly onto a single crystal gallium arsenide (GaAs) substrate.

19 Claims, 1 Drawing Sheet

BAF₂/GAAS ELECTRONIC COMPONENTS

This is a divisional of U.S. application Ser. No. 08/246,206 filed on May, 19, 1994, now abandoned.

BACKGROUND OF THE INVENTION

Materials used in semiconductor devices must have good semiconducting properties, good electron mobility, and the ability to host an epitaxial insulating material. Several materials are available which have good semiconducting properties and good electron mobilities but which are unsuitable because a good epitaxial insulator cannot be formed on them. Silicon, however, is widely used in semiconductor devices because epitaxial silicon dioxide forms naturally on silicon and silicon dioxide is an insulator. The disadvantage of silicon is that its mobility is not as high as in other semiconductors and silicon dioxide is not the strongest insulator available. This means that compromises in speed and performance are made when silicon is used in electronic devices.

Gallium arsenide (GaAs) is also a semiconductor and is used in some electronic applications. A device made out of GaAs would be faster than the same device made out of silicon because GaAs has an electron mobility that is considerably higher than that of silicon. Unfortunately, there is no native insulating oxide suitable for GaAs electronic devices.

Several materials have been used to provide insulating films on III-V compound semiconductor devices. Some of these films were previously used on silicon semiconductor devices. Examples include $SiO_2$, $Si_3N_4$, $Al_2O_3$, and $P_2O_3$ films. New films have also been developed specifically for the III-V compound semiconductors. For instance, A. J. Shuskus (U.S. Pat. No. 4,546,372) developed an essentially oxygen-free, amorphous osphorous-nitrogen glass passivating film for III-V compound semiconductors. Similarly, J. Nishizawa et al. (U.S. Pat. No. 4,436,770) disclose new gallium oxynitride and aluminum oxynitride insulating films for III-V compound semiconductors. These materials have found only limited application.

It would be useful to provide a new insulating material in gallium arsenide circuit elements which would provide advantages such as greater insulation and a high-break down voltage.

SUMMARY OF THE INVENTION

Accordingly, an object of this invention is to provide gallium arsenic circuit elements having high breakdown voltages.

Another object is to provide new, faster gallium arsenide circuit elements.

A further object of this invention is to provide new, improved gallium arsenide metal insulator semiconductor field effect transistors (MISFETs).

Yet another object of this invention is to provide new, improved gallium arsenide charge coupled devices (CCDs).

Yet a further object of this invention is to provide effective capacitors for gallium arsenide integrated circuits.

These and other objects of this invention are accomplished by providing:

gallium arsenide metal insulator semiconductor field effect transistors (MISFETs), charge couple devices (CCDs), and integrated circuit capacitor which are based on an insulator that is a single crystal epitaxial layer of barium fluoride grown or deposited directly onto a single crystal gallium arsenide substrate wherein the barium fluoride layer is separated from the gallium arsenide substrate only by a thin (~12 Å) layer of barium fluoride/gallium arsenide reaction product formed during the barium fluoride deposition process. The single crystal gallium arsenide substrate may be a wafer or epitaxial layer of gallium arsenide or a gallium arsenic based semiconductor alloy or a heterostructure of super-lattice made of a combination of gallium arsenic based alloys.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

Figure 1:
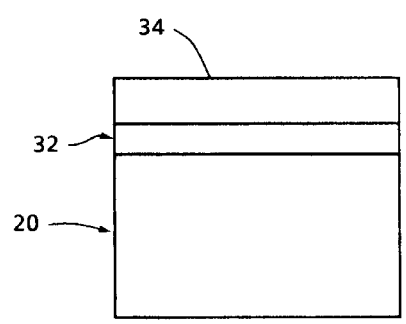
FIG. 1 is a schematic drawing of a barium fluoride/gallium arsenide epitaxial structure.

The present invention is directed to the use of single crystal epitaxial layers of barium fluoride as improved insulators in gallium arsenide circuit devices such as metal insulator semiconductor field effect transistors (MISFETs), charge couple devices (CCDs), and circuit capacitors. The single crystal epitaxial barium fluoride insulator layer is grown directly onto the clean single crystal gallium arsenide substrate and has the same crystal orientation as the substrate. The term single crystal gallium arsenide substrate includes gallium arsenide single crystal wafers, gallium arsenide epitaxial layers commonly known as epilayers on gallium arsenide single crystal wafers, doped gallium arsenide epilayers on gallium arsenide single crystal wafers, epilayers of alloys of gallium arsenide (for example, gallium aluminum arsenide, gallium indium arsenide, etc.) on gallium arsenide single crystal wafers, heterostructures of super-lattice made of combinations of alloys of gallium arsenide on gallium arsenide single crystal wafers, doped or undoped gallium arsenide epilayers on any suitable substrate materials, heterostructures of super-lattice made of combinations of alloys of gallium arsenide on a suitable substrate material. The barium fluoride is deposited in ultrahigh vacuum at a rate and temperature that allows the barium fluoride to react with the gallium arsenide to form a uniform single crystal epitaxial layer of barium fluoride/gallium arsenide reaction product which is one or two monolayers (about 12 Å) thick. The reaction product layer provides a surface upon which the single crystal epitaxial layer of barium fluoride will then deposit in the same crystal orientation as the underlying gallium arsenide substrate.

Single crystal epitaxial barium fluoride film is formed by exposing a clean, hot single crystal gallium arsenide substrate to barium fluoride vapor in ultrahigh vacuum environment with low background pressure. The single crystal gallium arsenide substrate bulk stoichiometry may be balanced, gallium rich, or arsenic rich. The single crystal gallium arsenide substrate may be doped or undoped. However because the single crystal gallium arsenide substrate is heated at from 500° C. to 700° C. for substantial periods of time during the $BaF_2$ deposition, some doping operations may have to be done after the barium fluoride deposition to alter the doping profile of the doped areas. The single crystal gallium arsenide substrate may have any of the conventional orientations including (100), (111), and their equivalents. In the experiments and examples we used commercial standard electronic grade polished and etched (100) and (111) oriented crystal wafers.

The commercial standard grade single crystal gallium arsenide substrate wafers come with a polycrystalline oxide passivation layer that must be removed. The presence of the polycrystalline passivation layer can be detected by analytical techniques like x-ray photoelectron spectroscopy (XPS) and reflective high energy electron diffraction (RHEED). The passivation layer will show oxygen in the XPS spectrum and a RHEED diffraction pattern that shows scattered dots and concentric circles. Removal of the passivation layer leaves the bare gallium arsenide surface whose smoothness is confirmed by the RHEED pattern that shows ordered spots connected with streaks and the absence of oxygen in the XPS spectrum. Conventional methods for removing the passivation layer may be used. A preferred method is be annealing the gallium arsenide in a vacuum. In the Examples, the single crystal gallium arsenide wafers were annealed in a VG Semicon V8OH deposition chamber for one hour at 600° C. in a vacuum of better than $1 \times 10^{-9}$ millibar.

A critical part of this invention is the formation of a thin, uniform, single crystal, epitaxial layer of barium fluoride/gallium arsenide reaction product on the surface of the single crystal gallium arsenide substrate. The barium fluoride/gallium arsenide reaction product is formed by exposing a clean, hot single crystal gallium arsenide substrate to barium fluoride vapor in ultrahigh vacuum. The temperature of the single crystal gallium arsenide substrate and the barium fluoride vapor flux rate are adjusted to allow the complete formation of the uniform reaction product layer before a substantial amount of barium fluoride can be deposited. The thickness of the barium fluoride/gallium arsenide reaction product layer is self limiting. After one or two monolayers (about 12 Å) of the uniform reaction product layer is formed, the barium fluoride deposits as a single crystal epitaxial layer of barium fluoride on the reaction product layer. If the barium fluoride is deposited too rapidly before a uniform, single crystal epitaxial layer of barium fluoride/gallium arsenide reaction product is completely formed, epitaxial growth of barium fluoride will occur in those places where the reaction product is first completed and an three dimensional island mode of barium fluoride growth will result. Channels between the barium fluoride islands present paths of conduction that defeat the insulative properties of the barium fluoride. This problem is avoided when, according to this invention, care is taken to slowly deposit barium fluoride initially so that a uniform, single crystal, epitaxial layer of reaction product is formed before substantial barium fluoride epitaxial formation begins. When this care is taken, the barium fluoride will deposit as a uniform, single crystal, epitaxial laver which is an excellent insulator.

The preferred method of producing the barium fluoride/gallium arsenide reaction layer on the single crystal gallium arsenide substrate is illustrated by examples 1 and 4. A standard commercial grade single crystal gallium arsenide crystal wafer is placed in a standard substrate heater in a commercial molecular beam epitaxial (MBE) deposition chamber model Semicon V8OH made by Vacuum Generators. The chamber is evacuated to a background pressure of preferably less than $10^{-8}$ millibars, more preferably less than $10^{-9}$ millibars, and still more preferably less than $10^{-10}$ millibars and is trapped with liquid nitrogen. The single crystal gallium arsenide wafer is heated for about an hour under vacuum at a heater temperature of 600° C. to remove the polycrystalline oxide passivation layer from the single crystal gallium arsenide surface. Barium fluoride is then vapor deposited at a rate of 2.5 Å per minute onto the clean, hot single crystal gallium arsenide substrate (600° C. heater temperature). The barium fluoride deposition was continued until the single crystal gallium arsenide reflective high energy electron diffraction (RHEED) pattern gives way to the epitaxial barium fluoride RHEED pattern. This takes about 5 minutes indicating that the barium fluoride/gallium arsenide reaction product layer is about 12 Å thick after which the single crystal epitaxial barium fluoride layer is deposited. If the single crystal gallium arsenide substrate surface has a (100) crystal orientation, the single crystal epitaxial barium fluoride layer will have a three dimensional (100) oriented structure as shown by RHEED pattern. On the other hand, if the single crystal gallium arsenide substrate surface has a (111) crystal orientation, the single crystal epitaxial barium fluoride layer will have a two dimensional (111) oriented structure as shown by RHEED pattern. The rate of deposition of barium fluoride must be slow enough to allow the complete formation of the uniform, single crystal, epitaxial barium fluoride/gallium arsenide reaction product layer before substantial amounts of barium fluoride are deposited on the reaction product layer. Example 3 illustrates that when barium fluoride is deposited at a rate of 25 Å per minute at 600° C. (heater temperature) from the beginning, the barium fluoride layer will grow as three dimensional islands with current conducting channels in between. In contrast, example 1 shows that a barium fluoride deposition rate of 10 Å per minute at 600° C. (heater temperature) produces a uniform, single crystal, epitaxial barium fluoride/gallium arsenide reaction product layer upon which a uniform, single crystal, epitaxial layer of barium fluoride is formed. Nevertheless, to assure the best quality, it is preferable to deposit the barium fluoride at a rate of from 1 to 5 Å per minute and more preferably at from 2 to 3 Å per minute, and most preferably at about 2.5 Å per minute. At a deposition rate of 2.5 Å per minute the uniform, single crystal epitaxial barium fluoride/gallium arsenide layer is formed in about 1 minute. Finally, the temperature given is the substrate heater temperature. As shown by example 1, the substrate is at a somewhat lower temperature. This is true for other commercial substrate heaters and is understood by those of ordinary skill in this art. Moreover, heater temperatures over the range of from 500° C. to 700° C. produce the same uniform, single crystal, epitaxial barium fluoride/gallium arsenide reaction product layer. Substrate heater temperature ranges are preferably from 500° C. to 700° C., more preferably from 550° C. to 650° C. and still more preferably from 575° C. to 625° C., and most preferably at about 600° C. At heater temperatures near the lower end of the range, the deposition rate is decreased to permit the complete formation of the reaction layer before a substantial amount of barium fluoride is deposited.

The barium fluoride/gallium arsenide reaction product layer is too thin (about 12 Å) for a determination of the actual structure and stoichiometric composition to be made. However, the same reaction product is consistently produced even at different substrate heater temperatures over the range of 500° C. to 700° C. Moreover, the reaction product can be characterized by a number of physical properties. First, the RHEED pattern of the reaction product is similar to that of $BaF_2$ (same symmetry, different spot shapes). Next, XPS results indicate lower Ba 3d bonding energies than those of $BaF_2$. Most important, uniform single crystal, epitaxial barium fluoride is deposited on single crystal gallium arsenide substrates that are coated with a uniform, epitaxial barium fluoride/gallium arsenide reaction product layer under conditions that would have produced amorphous or polycrystalline barium fluoride on a bare, clean single crystal arsenide substrate without the reaction product layer. It is the deposition of the uniform single crystal, epitaxial barium fluoride layer that confirms that the desired reaction product layer is present.

Once the uniform, single crystal, epitaxial barium fluoride/gallium arsenide reaction product layer has been formed on the single crystal gallium arsenide substrate, the deposition of a uniform, single crystal, epitaxial barium fluoride insulator layer becomes simple. The rate of deposition of barium fluoride is no longer as critical. For instance, example 4 shows that barium fluoride deposited at a rate of about 50 Å per minute (20X2.5 Å per minute) produces a uniform, single crystal epitaxial barium fluoride layer after the reaction layer has been form. This is in direct contrast with example 3 where barium fluoride deposited at 25 Å per minute at 600° C. onto a bare single crystal gallium arsenide substrate produces a barium fluoride layer having three dimension island growth with channels in between. Recently, it has been discovered that uniform, single crystal epitaxial barium fluoride can be formed by depositing barium fluoride vapor on uniform, epitaxial barium fluoride/gallium arsenide reaction product coated substrates at temperatures of 400° C., 300° C., and room temperature at deposition rates of 50 Å per minute. The crystal orientation of the uniform, single crystal epitaxial barium fluoride layer is the same as that of the single crystal gallium arsenide substrate. For example uniform (100) oriented single crystal epitaxial barium fluoride layers are deposited on (100) oriented single crystal gallium arsenide substrates and uniform (111) oriented single crystal epitaxial barium fluoride layers are deposited on (111) single crystal gallium arsenide substrates. This means that the intervening barium fluoride/gallium arsenide reaction product layer is uniform and of the same crystal orientation as the single crystal gallium arsenide substrate.

After the uniform epitaxial barium fluoride/gallium arsenide reaction product layer is formed, the vacuum is maintained at a background pressure of preferably less than $10^{-8}$ millibars, more preferably less than $10^{-9}$ millibars, and still more preferably less than $10^{-10}$ millibars. The barium fluoride is deposited at a rate of preferably 1 to 100 Å per minute, more preferably 1 to 50 Å per minute, and still more preferably 1 to 25 Å per minute.

Single crystal epitaxial layers of barium fluoride grown at temperatures above 500° C. contain small amounts of gallium on the order of 1 to 50 ppm. We have found that these traces of gallium do not adversely affect the insulative properties of the barium fluoride layer. As illustrated by example 5, gallium containing barium fluoride (1800 Å thick) produced at 600° C. has a capacitance of 48.0±2.0 pF, an average breakdown voltage of 944,000 V/cm, and a dielectric constant of ~7.5 which is close to that of bulk barium fluoride. Depositing barium fluoride on the uniform epitaxial layer of barium fluoride/gallium arsenide reaction product at temperatures of 400° C. or lower produces a single crystal epitaxial barium fluoride layer that is free of gallium. However, the insulating properties of the gallium-containing and the gallium-free barium fluoride layers are the same. Therefore the term barium fluoride layer as used in describing the improved devices (capacitors, MISFETs, CDDs, etc.) of this invention includes both gallium-containing and gallium free barium fluoride.

FIG. 1 is a schematic drawing of a cross section of a basic structure comprising a single crystal gallium arsenide semiconductor substrate 20, a uniform, epitaxial layer of the barium fluoride/gallium arsenide reaction product 32 covering a portion of the surface of the single crystal gallium arsenide substrate 20, and a uniform, single crystal epitaxial barium fluoride insulator layer 34 which was deposited on the uniform epitaxial barium fluoride/gallium arsenide reaction product layer 32. The uniform, epitaxial barium fluoride/gallium arsenide reaction product layer 32 is about 12 Å thick. For electronic devices the uniform, single crystal epitaxial barium fluoride insulator layer 34 will be from about 150 to 1000 Å thick, but layers up to 2500 Å are easy to produce. In practice, the electrical properties of the thin barium fluoride/gallium arsenide reaction product layer 32 may be ignored and the structure may simply be considered to be a single crystal epitaxial layer of barium fluoride 34 deposited on the single crystal gallium arsenide substrate. This basic structure can be used to make integrated circuit capacitors, metal insulator semiconductor field effect transistors (MISFETS), charge couple devices (CCDs), and other types of gallium arsenide electronic devices requiring a metal insulator semiconductor junction.

A structure of the type shown in FIG. 1 can be used as the dielectric portion of a gallium arsenide semiconductor integrated circuit capacitor. Epitaxial barium fluoride is formed on the gallium arsenide to provide the dielectric insulator element of the capacitor and 2 metal electrodes are deposited on opposite surfaces of the epitaxial barium fluoride to form a metal insulator metal (MIM) integrated circuit capacitor. Similarly, by depositing one metal on top of the single crystal epitaxial barium fluoride layer and another electrode on the gallium arsenide semiconductor a metal insulator semiconductor (MIS) capacitor can be produced. A similar procedure can be used to produce an semiconductor insulator semiconductor (SIS) capacitor.

Figure 2A:
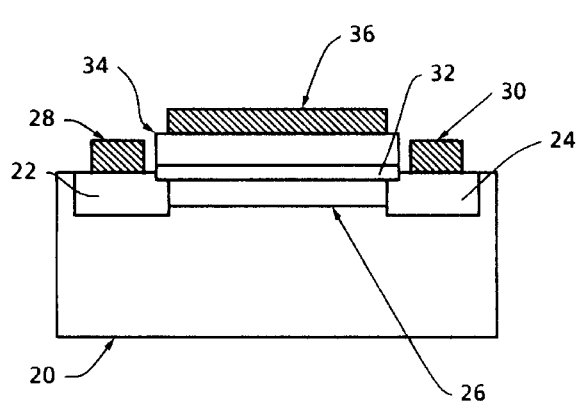
FIG. 2A is a schematic drawing of a depletion mode metal insulator semiconductor field effect transistor (MISFET) containing the epitaxial structure of FIG. 1.
Figure 2B:
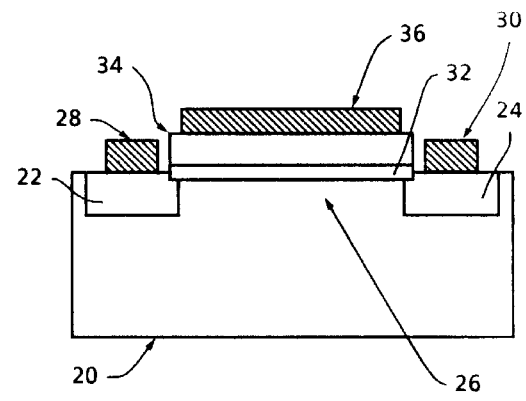
FIG. 2B is a schematic drawing of an enhancement mode MISFET containing the epitaxial structure of FIG. 1.

The basic barium fluoride epitaxial insulator layer 34 single crystal gallium arsenide semiconductor substrate 20 structure shown in FIG. 1 can also be used as the basis of an improved gallium arsenide metal insulator semiconductor field effect transistor (MISFET). The element may be used to make depletion mode MISFETs as well as enhancement mode MISFET's. This will include n-channel depletion mode MISFET's p-chahnel depletion mode MISFET's, n-channel enhancement mode MISFET's, and p-channel enhancement mode MISFET's. FIG. 2A is a schematic drawing representing a depletion mode MISFET according to this invention. Shown are a single crystal gallium arsenide semiconductor substrate 20 which has been doped to produce a source region 22 a drain region 24, and a channel region 26 all of the same carrier type. The channel region 26 connects the source region 22 to the drain region 24. An ohmic (metal) source electrode 28 is deposited onto the source region 22 and an ohmic (metal) drain electrode 30 is deposited onto the drain region 24. An insulator epitaxial barium fluoride layer 34 is deposited on the surface of the single crystal gallium arsenide semiconductor substrate 20 over the channel region 26. A metal gate electrode 36 is deposited onto the barium fluoride epitaxial layer 34 so that the barium fluoride layer 34 insulates the gate electrode 36 from the channel region 26. The thin barium fluoride/ gallium arsenide reaction product zone 32 is shown between the barium fluoride epitaxial layer 34 and the channel region 26 of the single crystal gallium arsenide semiconductor substrate 20. The reaction product zone 32 will not significantly affect the operation of the MISFET device. FIG. 2B is a schematic drawing representing an enhancement mode MISFET according to this invention. The labeled parts are the same as in FIG. 2A except that the channel region 26 is doped with a different carrier type than that of the source region 22 and the drain region 24.

The relatively high temperature (500° C. or above) of the present process, may require that certain doping steps be performed after the barium fluoride epitaxial layer has been grown. However, the single crystal gallium substrate under the barium fluoride layer may be doped by using conventional ion beam implantation techniques. The dopant ions will pass through the barium fluoride layer and be implanted in the single crystal gallium arsenide substrate. The single crystal gallium arsenide substrate will then be annealed to diffuse the dopant ions in the single crystal gallium arsenide substrate. For example, a MISFET device may be produced by combining the present process within beam implantation as follows. First, a barium fluoride epitaxial crystal insulator layer is grown on a single crystal gallium arsenide substrate according to the process of this invention. Holes are left in the barium fluoride film for source and drain regions. The source and drain regions are then doped according to conventional techniques. metal electrodes are then deposited onto the source and drain regions. Next an ion beam is used to implant dopant ions through the barium fluoride film into the channel region in the single crystal gallium arsenide substrate. The metal electrodes protect the source and drain regions from the ion beam. The single crystal gallium arsenide substrate is annealed to diffuse the ion implanted dopant to complete the doping of the channel region.

The process and products of the present invention are designed to be used to produce large scale integrated circuits. For example, this includes large scale computer logic and control circuit arrays containing many depletion mode MISFETS, enhancement mode MISFETs, MIM capacitors, etc. It also includes large scale memory arrays containing many charge couple devices and associated circuitry.

Figure 4:
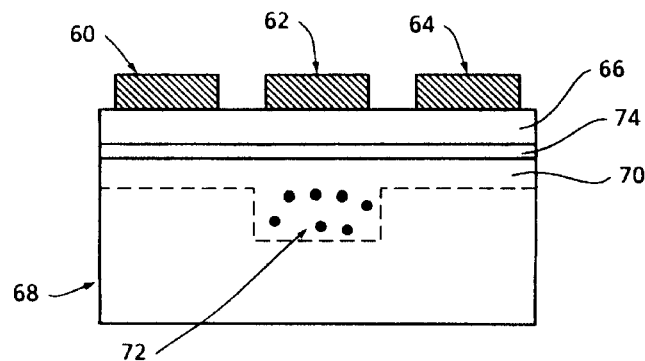
FIG. 4 is a schematic of a charge coupled device (CCD) containing of the epitaxial structure of FIG. 1.

FIG. 4 is a schematic drawing representing a charge coupled device (CCD) according to this invention. Shown is a p-type single crystal gallium arsenide wafer 68 with or without an epitaxial layer of single crystal gallium arsenide. An insulator barium fluoride epitaxial layer 66 is deposited onto the gallium arsenide wafer 68. The thin barium fluoride/gallium arsenide reaction product layer 74 is shown between the barium fluoride epitaxial layer 66 and the gallium arsenide wafer 68. The reaction product layer 74 will not significantly affect the operation of the charge coupled device. Metal gate electrodes 60, 62, and 64 are deposited onto the barium fluoride epitaxial layer 66 so that the barium fluoride layer 66 insulates the metal gate electrodes 60, 62, and 64 from the p-type single crystal gallium arsenide wafer 68. The metal gate electrodes 60, 69, and 64 serve as gates for the charge transfer signals. When gate 62 has a higher (more positive) voltage than gates 60 and 64, the charges 72 are concentrated in region 70 just below gate 62 which serves as a charge storage. When either gate 60 or 64 is pulsed to a higher (more positive) voltage than gate 62 the charge 72 will be transferred to the pulsed gate. The device shown in FIG. 4 is just an illustrative example of how to use the present invention in charge couple devices, different schemes and layouts can be used for the charge couple devices.

Finally, a useful intermediate product is produced by forming the uniform, thin coating of barium fluoride/gallium arsenide reaction product on a single crystal gallium arsenide substrate according to the method described above, and then removing the barium fluoride vapor source and continuing to heat the substrate in the vacuum until any unreacted barium fluoride is removed from the coating. Single crystal epitaxial barium fluoride layers can then be deposited on the barium fluoride/gallium arsenide reaction product layer by the methods described above. Moreover, by depositing the barium fluoride vapor at a temperature of from room temperature to 400° C., or preferably from room temperature to 300° C. with the other conditions (deposition rate, vacuum) being the same, a uniform, single crystal epitaxial barium fluoride insulator layer is formed which is free of gallium ions.

As stated above, the term single crystal gallium arsenide substrate preferably includes doped or undoped gallium arsenide single crystal wafers, doped or undoped gallium arsenide epitaxial layers on gallium arsenide single crystal wafers, doped or undoped epitaxial layers of gallium arsenide alloys (for example, gallium aluminum arsenide, gallium indium arsenide, etc.) on single crystal gallium arsenide wafers, heterostructures of super-lattice made of combinations of gallium arsenide alloys on gallium arsenide single crystal wafers, doped or undoped gallium arsenide single crystal epitaxial layers on suitable substrate materials, doped or undoped epitaxial layers of gallium arsenide alloys on suitable substrate materials, and heterostructures of super-lattice made of combinations of gallium arsenide alloys on suitable substrate materials. More preferably the single crystal gallium arsenide substrate includes doped or undoped gallium arsenide single crystal wafers, doped or undoped gallium arsenide epitaxial layers on gallium arsenide single crystal wafers, and doped or undoped gallium arsenide single crystal epitaxial layers on suitable substrate materials. The gallium arsenide alloys include those that are conventionally used in semiconductor devices. Gallium arsenide alloy that are rich in gallium are preferred. The suitable substrate materials include materials that provide physical support for a thin epitaxial layer of gallium arsenide or gallium arsenide alloys without chemically or electrically interferring with the operation of the epitaxial layer. For example, a thin single crystal epitaxial layer of gallium arsenide on a hybrid semiconductor device or on a chemically inert, electrically insulating circuit board structure. Thus, the single crystal gallium arsenide substrate need not be a wafer but rather can be a thin epitaxial layer requiring support by a non-gallium arsenide material.

EXAMPLE 1

The barium fluoride film was grown on single crystal gallium arsenide using a standard procedure called molecular beam epitaxy (MBE). The film was grown inside a commercial MBE deposition chamber made by Vacuum Generators (model V80-M). The MBE system above has both Knudsen cells and e-beam sources and a 30 kV RHEED system to monitor the film structure during film deposition. The substrate heater is capable of holding up to 3 inch diameter wafers and control the substrate temperature to within ±0.1° C. at 1000° C. and a maximum deviation of the temperature across the substrate of ±0.1° C. The temperature is controlled by using a thermocouple located inside the substrate heater. All temperatures quoted here are the substrate heater thermocouple readings. Independent measurements of the sample temperatures done using an optical pyrometer shows that when the thermocouple monitoring the substrate heater read 750.0° C. the substrate temperature was closer to 710.0° C. ±0.5° C. (0.5° C. is the accuracy of the optical pyrometer). Differences between the substrate temperature and the thermocouple readings change with temperature. However reproducibility in the thermocouple readings results in reproducibility in the growth conditions. The pressure inside the MBE system is kept below $3.0 \times 10^{-11}$ mbars most of the time. When the substrate and Knudsen cells containing the source are heated to the conditions for deposition the pressure inside the chamber will rise to a pressure not above $1.0 \times 10^{-10}$ mbars. The single crystal gallium arsenide substrate used was a commercial (100) oriented 2 inch diameter wafer with a carrier concentration of $3.0 \times 10^{18}$ carriers/cm$^3$ and an arsenic to gallium concentration ratio of 50/50. The wafer was polished and etched using standard industry procedures. Before deposition of the film the gallium arsenide crystal was created by standard heat treatment in ultrahigh vacuum. Then the gallium arsenide crystal wafer was heated at 600° C. until the electron diffraction pattern looked "streaky". This took about 60 minutes.

Once the gallium arsenide was heat treated the substrate crystal (GaAs) was kept at 600° C. ±1° C. The barium fluoride was heated in a standard Knudsen cell inside the MBE system. The cell containing the barium fluoride was heated until 1050° C. ±1° C. This condition created a flux rate of approximate $10^{14}$ atoms/(cm$^2$xsec). When a consistent flux was obtained, deposition of barium fluoride was achieved by opening shutters located in front of both the barium fluoride source and the gallium arsenide crystal. Deposition for 60 minutes yielded a barium fluoride film approximately 600 Å thick. After the desired barium fluoride film thickness was achieved (1800 Å) the shutters were closed and both the source and the gallium arsenide were cooled down to room temperature (25° C.) using a cooling rate of 0.5° C. per second. Once the gallium arsenide crystal with the barium fluoride film reached room temperature it was taken out of the MBE system. A (100) oriented single crystal epitaxial film of barium fluoride was produced.

EXAMPLE 2

The procedure of example 1 was repeated using a commercial standard electronic grade polished and etched (111) oriented single crystal gallium arsenide wafer. In this example the single crystal gallium arsenide wafer had the same carrier concentration density ($3.0 \times 10^{18}$ carriers/cm$^2$) but the ratio of As to Ga was 52/48. A (111) oriented single crystal epitaxial film of barium fluoride was produced.

EXAMPLE 3

The procedure of example 1 was repeated except the rate of barium fluoride deposition was increased to 25 Å per minute. The resulting barium fluoride layer was unsuitable as an insulator because three dimensional island growth had occurred with channels between the islands.

EXAMPLE 4

The procedure of example 1 was repeated except that the barium fluoride deposition rate was only 2.5 Å per minute and was stopped when the GaAs RHEED pattern gave way to a three dimensional epitaxial BaF$_2$ RHEED pattern. This indicates the completion of the epitaxial layer of barium fluoride/gallium arsenide reaction product. This happened in less than 5 minutes.

The presence of a barium fluoride/gallium arsenide reaction product layer is demonstrate by the XPS spectra which showed new lines near the Ba 3d ³⁄₂ and ⁵⁄₂ peaks as the barium fluoride was evaporated off. These peaks do not correspond to BaF$_2$. The reaction layer is not volatile at 600° C. in vacuum.

Barium fluoride was then deposited at a rate of about 50 Å per minute onto the barium fluoride/gallium arsenide reaction product layer to produce a uniforrn single crystal epitaxial layer of barium fluoride on the substrate. This contrasts with Example 3 where barium fluoride deposition at a ratio of 25 Å per minute onto a clean (no reaction product layer) gallium arsenide surface produced a barium fluoride layer containing three dimensional islands and channels.

EXAMPLE 5

Figure 3:
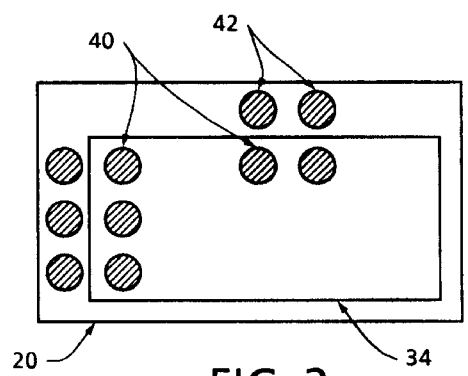
FIG. 3 is a schematic drawing of a top view of the test set up used in example 6 to measure the capacitance and the breakdown voltage of (100) oriented single crystal epitaxial barium fluoride film.

The procedure of example 1 was repeated until a (100) oriented single crystal epitaxial film 1800 Å thick was produced. FIG. 3 is schematic top view of the test set up shown are an array of 5 (five) gold dots 40 evaporated onto the (100) oriented single crystal epitaxial barium fluoride film 34 and a corresponding array of 5 (five) gold dots 42 evaporated on to the adjoining edge of the (100) oriented single crystal gallium arsenide substrate 20 not exposed to the barium flux. Adjacent gold dots 40 and 42 form pairs that were used in the measurements. Indium-soldered gold wires were attached to the gold dots 40 on the barium film 34 and to the gold dots 42 on the gallium arsenide substrate 20. Capacitance and breakdown voltage measurements were done on all five pairs of adjacent gold dots (electrodes). Result s showed that capacitance values of 48.0 pF between the barium film and the gallium arsenide with a maximum deviation of ±2.0 pF were obtained. Breakdown fields ranging between $8.5 \times 10^5$ and $1.1 \times 10^6$ V/cm were obtained. The dielectric constant was found to be ~7.5, a value close to that of the bulk material.

EXAMPLE 6

The procedure of example 1 was repeated except that the barium fluoride deposition rate was only 2.5 Å per minute and was stopped when the GaAs RHEED pattern gave way to a three dimensional epitaxial BaF$_2$ RHEED pattern. This happened in less than 5 minutes. The substrate temperature was then reduced to 500, 400, and 300° C. and held for 30 minutes at each temperature while deposition of BaF$_2$ at 2.5 Å per minute continued. The RHEED pattern was continuously monitored during this time. Other than a decrease in the spot size and an increase in spot intensity, no change in the RHEED pattern was detected. After positing for 30 minutes at 300° C., the BaF$_2$ source temperature was raised from 1000° C. to 1100° C. The resultant flux gauge reading increased by a factor of about twenty. (to about 50 Å per minute) The RHEED pattern, however, was not affected. The film was then stored in the deposition chamber for four days. BaF$_2$ deposition was resumed with a substrate temperature of 25° C. and at the same range of flux gauge readings. The RHEED pattern remained unchanged.

Obviously, numerous other modifications and variations of the present invention are possible in light of the foregoing teachings. It is therefore to be understood that within the scope of the appended claims the invention may be practiced otherwise than as specifically described.

What is claimed is:

1. A method of producing a BaF$_2$/GaAs electronic component comprising the steps of heating a clean single crystal gallium arsenide substrate surface in a vacuum, and exposing the heated substrate surface to barium fluoride vapor at a flux such that barium fluoride is deposited on the surface of the substrate at a deposition rate sufficiently low to produce, on the surface of the substrate, a thin, uniform, epitaxial layer of barium fluoride/gallium arsenide reaction product, substantially free of unreacted barium fluoride.

2. The method of claim 1 wherein the single crystal gallium arsenide substrate surface is heated to a temperature in the range from 500° C. to 700° C. during the formation of the barium fluoride/gallium arsenide reaction product.

3. The method of claim 1 wherein the single crystal gallium arsenide substrate surface is heated to a temperature in the range from 550° C. to 650° C. during the formation of the barium fluoride/gallium arsenide reaction product.

4. The method of claim 1 wherein the single crystal gallium arsenide substrate surface is heated to a temperature in the range from 575° C. to 625° C. during the formation of the barium fluoride/gallium arsenide reaction product.

5. The method of claim 1 wherein the barium fluoride is deposited on the surface of the substrate at a rate of from 1 to 5 Å per minute during the formation of the barium fluoride/gallium arsenide reaction product.

6. The method of claim 1 wherein the barium fluoride is deposited on the surface of the substrate at a rate of from 2 to 3 Å per minute during the formation of the barium fluoride/gallium arsenide reaction product.

7. The method of claim 1 wherein the single crystal gallium arsenide substrate is selected from the group consisting of gallium arsenide single crystal wafers, gallium arsenide epitaxial layers on gallium arsenide single crystal wafers, epitaxial layers of gallium arsenide alloys on single crystal gallium arsenide wafers, heterostructures of super-lattice made of combinations of gallium arsenide alloys on gallium arsenide single crystal wafers, gallium arsenide single crystal epitaxial layers on suitable substrate materials, epitaxial layers of gallium arsenide alloys on suitable substrate materials, and heterostructures of super-lattice made of combinations of gallium arsenide alloys on suitable substrate materials.

8. The method of claim 7 wherein the single crystal gallium arsenide substrate is selected from the group consisting of gallium arsenide single crystal wafers, gallium arsenide epitaxial layers on gallium arsenide single crystal wafers, and gallium arsenide single crystal epitaxial layers on suitable substrate materials.

9. The method of claim 8 wherein the single crystal gallium arsenide substrate is a gallium arsenide single crystal wafer.

10. The method of claim 8 wherein the single crystal gallium arsenide substrate is a gallium arsenide single crystal epitaxial layer on a gallium arsenide single crystal wafer.

11. The method of claim 1 wherein the uniform epitaxial layer of barium fluoride/gallium arsenide reaction product has the same orientation as that of the single crystal gallium arsenide substrate surface.

12. The method of claim 1 in which the vacuum is less than $10^{-9}$ millibars background pressure.

13. The method of claim 1 wherein the thin, uniform epitaxial layer of barium fluoride/gallium arsenide reaction product is held to a thickness less than 20 Å.

14. The method of claim 1 wherein the thin, uniform epitaxial layer of barium fluoride/gallium arsenide reaction product is held to a thickness less than 15 Å.

15. The method in accordance with claim 1 in which said step of exposing the heated substrate surface to barium fluoride vapor is followed by the step of depositing barium fluoride onto said thin, uniform, epitaxial layer of barium fluoride/gallium arsenide reaction product.

16. The method in accordance with claim 15 in which said clean single crystal gallium arsenide substrate surface is a surface of a channel region of a substrate doped to provide a source region, a channel region and a drain region of a field effect transistor.

17. The method in accordance with claim 15 in which the steps of exposing the heated substrate surface to barium fluoride vapor and depositing barium fluoride onto said thin, uniform, epitaxial layer of barium fluoride/gallium arsenide reaction product produce an insulator structure, and in which a capacitor is formed by applying electrodes to said insulator structure.

18. The method in accordance with claim 15 in which the steps of exposing the heated substrate surface to barium fluoride vapor and depositing barium fluoride onto said thin, uniform, epitaxial layer of barium fluoride/gallium arsenide reaction product, are followed by the application of gate electrodes to the deposited barium fluoride to produce a chargecoupled device.

19. The method in accordance with claim 1 in which said step of exposing the heated substrate surface to barium fluoride vapor is followed by the step of depositing barium fluoride onto said thin, uniform, epitaxial layer of barium fluoride/gallium arsenide reaction product at a deposition rate greater than said low deposition rate.

* * * * *